US008372565B2

(12) United States Patent
Tian et al.

(10) Patent No.: US 8,372,565 B2
(45) Date of Patent: Feb. 12, 2013

(54) METHOD FOR OPTIMIZING SOURCE AND MASK TO CONTROL LINE WIDTH ROUGHNESS AND IMAGE LOG SLOPE

(75) Inventors: Kehan Tian, Poughkeepsie, NY (US); Alan E. Rosenbluth, Yorktown Heights, NY (US); David O. Melville, New York, NY (US); Jaione Tirapu Azpiroz, Poughkeepsie, NY (US); Saeed Bagheri, Croton-on-Hudson, NY (US); Kafai Lai, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 228 days.

(21) Appl. No.: 12/872,312

(22) Filed: Aug. 31, 2010

(65) Prior Publication Data
US 2012/0052418 A1   Mar. 1, 2012

(51) Int. Cl.
*G03F 9/00* (2006.01)
(52) U.S. Cl. ................ 430/30; 430/5; 716/54
(58) Field of Classification Search .............. 430/5, 30; 716/54
See application file for complete search history.

(56) References Cited

U.S. PATENT DOCUMENTS

| 6,563,566 B2 | 5/2003 | Rosenbluth et al. |
| 7,057,709 B2 | 6/2006 | Rosenbluth |
| 7,493,589 B2 | 2/2009 | Socha |

OTHER PUBLICATIONS

Socha, Robert, et al.—Simultaneous Source Mask Optimization (SMO) Proceedings of SPIE (2005)—Photomask and Next-Generation Lithography Mask Technology XII, vol. 5853, pp. 180-193.
Gallatin, Gregg M.—Resist Blur and Line Edge Roughness—Proceedings of SPIE vol. 5754 (SPIE 2005) Optical Microlithography XVIII—pp. 38-52.
Rosenbluth, Alan E., et al.—"Intensive Optimization of Masks and Sources for 22nm Lithography"—Proceedings of SPIE vol. 7274, 727409-1 (SPIE 2009)—Optical Microlithography XXII.
Tian, Kehan, et al.—"Benefits and Trade-Offs of Global Source Optimization in Optical Lithography"—Proceedings of SPIE vol. 7274m 72740C (SPIE 2009)—Optical Microlithography XXII.
Rosenbluth, Alan E., et al.—"Global Optimization of Masks, Including Film Stack Design to Restore TM Contract in High NA TCC's"—Proceedings of SPIE vol. 6520, 65200P, (2007) Optical Microlithography XX.
U.S. Appl. No. 12/605,732—Title: "Constrained Optimization of Lithographic Source Intensities Under Contingent Requirements" Inventor: Alan E. Rosenbluth, et al. Filing Date: Oct. 26, 2009.
U.S. Appl. No. 12/334.488—Title: "Determining Manufacturability of Lithographic Mask Using Continuous Derivatives Characterizing the Manufacturability on a Continuous Scale" Inventor: Tadanobu Inoue, et al. Filing Date: Dec. 14, 2008.
U.S. Appl. No. 12/334,482—Title: "Determining Manufacturability of Lithographic Mask by Reducing Target Edge Pairs Used in Determining a Manufacturing Penalty of the Lithographic Mask" Inventor: Tadanobu Inoue, et al. Filing Date: Dec. 14, 2008.
U.S. Appl. No. 12/334,485—Title: "Determining Manufacturability of Lithographic Mask by Selecting Target Edge Pairs Used in Determining a Manufacturing Penalty of the Lithographic Mask" Inventor: Tadanobu Inoue, et al. Filing Date: Dec. 14, 2008.
Rosenbluth, Alan E., et al.—"Optimum Mask and Source Patterns to Print a Given Shape"—JM3 1(1) pp. 13-30 (Apr. 2002)—SPIE Digital Library.

*Primary Examiner* — Christopher Young
(74) *Attorney, Agent, or Firm* — Wenjie Li

(57) ABSTRACT

A method for illuminating a mask with a source to project a desired image pattern through a lithographic system onto a photoactive material including: defining a representation of the mask; obtaining a fractional resist shot noise (FRSN) parameter; determining a first relationship between a first set of optical intensity values and an edge roughness metric based on the FRSN parameter; determining a second relationship between a second set of optical intensity values and a lithographic performance metric; imposing a set of metric constraints based on one of the first and second relationships; setting up an objective function of optimization based on the remaining of the two relationships; determining optimum constrained values of the representation of the mask based on the set of metric constraints and the objective function; and outputting these values.

41 Claims, 8 Drawing Sheets

METHOD FOR OPTIMIZING SOURCE AND MASK TO CONTROL LINE WIDTH ROUGHNESS AND IMAGE LOG SLOPE

FIELD OF THE INVENTION

This invention relates generally to lithographic formation of integrated circuit patterns on a semiconductor chip, and more particularly to a method for selecting and using combinations of illumination source characteristics and diffracting shapes on a mask to form integrated circuit patterns on a semiconductor chip with controlled line width roughness and image log slope.

BACKGROUND OF THE INVENTION

Miniaturized electronic components such as integrated circuits (ICs) are typically manufactured using photolithography technology. In a photolithography process, a photoresist layer is formed on a semiconductor substrate, such as a silicon wafer. The photoresist layer is exposed through a photomask with a desired pattern to a source of actinic radiation. The radiation exposure causes a chemical reaction in the exposed areas of the photoresist and creates a latent image corresponding to the mask pattern in the photoresist layer. The photoresist is next developed in a developer solution, usually an aqueous base solution, to remove either the exposed portions of the photoresist for a positive photoresist or the unexposed portions of the photoresist for a negative photoresist. The patterns formed in the photoresist layer can then be transferred to the semiconductor substrate via processes such as deposition, etching, or ion implantation.

A critical dimension (CD) refers to the feature size and spacing between features (patterns) according to a design specification for a semiconductor device. CDs are critical for the proper functioning of the semiconductor device. When the CD of desired lithographic patterns approaches the resolution limit of an optical lithography system, image distortions become a significant problem. As the minimum CDs for semiconductor devices continue to decrease, the limited resolution of lithographic tools poses a challenge to improvements in IC manufacture. In order to make the manufacture of future IC products feasible, lithographic systems will be required to achieve adequate image fidelity when the ratio of the minimum CD to the resolution of the lithographic system becomes very low.

Many methods have been developed to reduce image distortions and improve image fidelity. One class of the enhancement methods adjusts the shapes of mask features to compensate the image distortions. For example, the biasing technique alters the mask shapes by widening the mask shapes at the tips of line features or lengthening the features to compensate for line-shortening effects. However, in some situations geometric constraints that are inherent to the desired circuit pattern may require that the mask shapes be perturbed in opposite directions and/or contradictory positions. In these situations, the biasing technique is ineffective to achieve the desired CDs of the desired image.

Another class of enhancement techniques improves contrast in the images by shifting the phase of the light projected from the mask such as "attenuated phase shift" and "alternating phase shift" techniques. The "attenuated phase shift" technique improves image sharpness by increasing the rate of change in illumination amplitude across the edge of mask features. This is achieved by using a phase-shifting material of slightly negative transmittance for dark areas of the pattern, rather than the conventional material of zero transmittance.

The "alternating phase shift" technique achieves further contrast improvement by successively shifting the phase of adjacent bright features between 0° and 180°. In this way, the contrast of illumination intensity across the edge of image features is further increased compared to either conventional masks or the "attenuated phase shift" masks. However, both "attenuated phase shift" and "alternating phase shift" techniques does not directly address the above-mentioned intrinsic geometric constraints in certain circuit patterns, though they do alleviate their severity by reducing image blur.

In addition, the "alternating phase shift" technique often adds unwanted features to image patterns. This occurs when circuit phases are laid out in such a way that the desired alternation in phase can only be achieved by introducing artificial 0° and 180° mask transitions which print as unwanted patterns. For example, when opposite phases are applied to bright regions that pass in close proximity to one another at a certain point on the mask, the phase must make such an unwanted transition if the bright regions are connected together elsewhere in the mask pattern. Such unwanted phase transitions will print as a dark fringe within the nominally bright connecting area, and must be trimmed away using a second exposure.

More recently, Source Mask Optimization (SMO) has been proposed to reduce image distortions and improve image fidelity. SMO is a photolithography resolution enhancement technique used to compensate for image errors due to aberrations, diffraction or process effects. It is not strongly limited by the intrinsic geometric constraints of the pattern layout. SMO technique uses intensively optimized wave distributions to illuminate both the mask and the wafer during lithographic exposures. SMO is proposed as a means for exploiting all available degrees of freedom in the band-limited exposure process. The fundamental goal of SMO is to determine the optimum set of image forming waves that can propagate within the finite numerical aperture (NA) of the projection lens of the exposure tool, as formed using a manufacturable mask. NA is a measure of the directional extent of the light that can be collected by the lens.

SMO may optimize images based on a threshold intensity which determines where the perimeter of a printed feature will be formed. The threshold intensity is the light intensity above which a desired feature will be printed. Conventional SMO techniques assume that printed circuit features at the threshold intensity have a smooth edge. However, it is known that in practice the perimeter of printed circuit features will actually exhibit a fine-scale roughness whose fluctuations are typically sharper than the lens resolution.

In a photolithography process, the width of a resist feature can vary over the perimeter of the feature. This variation of width is called line width roughness (LWR). When the variation of the width along one edge of the resist feature is examined, the deviation of a line edge from a straight line is called line edge roughness (LER). LER is caused by a number of statistically fluctuating effects such as shot noise (photon flux variations), statistical distributions of chemical species in the resist such as photoacid generators (PAGs), the random walk nature of acid diffusion during chemical amplification, and the nonzero size of resist polymers being dissolved during development. It is not always clear which process or processes dominate in their contribution to LER. LER becomes important for feature sizes of 100 nm or less, and can become a significant source of CD local uniformity control problems for features below 50 nm.

While efforts have been made to reduce LER via improved processes and resists, the residual roughness in state-of-theart IC devices is large enough that improvements in the image to reduce LER in the transferred patterns are also needed.

SUMMARY OF THE INVENTION

The present invention provides a method for using combinations of illumination source characteristics and diffracting shapes on a mask to form integrated circuit patterns on a semiconductor chip with controlled line width roughness and image log slope. This invention also provides a machine readable storage medium having one or more machine readable program codes stored thereon for causing the machine to perform a method for using combinations of illumination source characteristics and diffracting shapes on a mask to form integrated circuit patterns on a semiconductor chip with controlled line width roughness and image log slope.

In one aspect, the present invention relates to method for illuminating a mask with a source to project a desired image pattern through a lithographic system onto a photoactive material including the steps of: defining a representation of the mask; obtaining a fractional resist shot noise (FRSN) parameter; determining a first relationship between a first set of optical intensity values and an edge roughness metric based on the FRSN parameter; determining a second relationship between a second set of optical intensity values and a lithographic performance metric; imposing a set of metric constraints in accordance with one of the first and second relationships; setting up an objective function of optimization in accordance with the remaining of the first and second relationships; determining optimum constrained values of the representation of the mask in accordance with the set of metric constraints and the objective function of optimization; and outputting the optimum constrained values of the representation of the mask.

The method preferably further includes the steps of fabricating the mask according to the optimum constrained values of the representation of the mask and projecting the mask through the lithographic system onto the photoactive material.

In another aspect, the present invention relates to a method for illuminating a mask with a source to project a desired image pattern through a lithographic system onto a photoactive material including the steps of: defining a representation of the mask; obtaining a fractional resist shot noise (FRSN) parameter; determining a first relationship between a first set of optical intensity values and an edge roughness metric based on the FRSN parameter; determining a second relationship between a second set of optical intensity values and a lithographic performance metric; determining a third relationship between a set of polygons in the mask and a mask-writing difficulty metric; imposing a set of metric constraints in accordance with the first, second, and third relationships; setting up an objective function of optimization in accordance with one of the first, second, and third relationships; determining optimum constrained values of the representation of the mask in accordance with the set of metric constraints and the objective function of optimization; and outputting the optimum constrained values of the representation of the mask.

In still another aspect, the present invention relates to a method for illuminating a mask with a source to project a desired image pattern through a lithographic system onto a photoactive material including the steps of: defining a representation of the mask and a representation of a projection process; obtaining a fractional resist shot noise (FRSN) parameter; determining a first relationship between a first set of optical intensity values and an edge roughness metric based on the FRSN parameter; determining a second relationship between a second set of optical intensity values and a lithographic performance metric; imposing a set of metric constraints in accordance with one of the first and second relationships; setting up an objective function of optimization in accordance with the remaining of the first and second relationships; determining optimum constrained values of the representations of the mask and the projection process in accordance with the set of metric constraints and the objective function of optimization; and outputting the optimum constrained values of the representations of the mask and the projection process The method preferably further includes the steps of fabricating the mask according to the optimum constrained values of the representations of the mask and projecting the mask through the lithographic system onto the photoactive material according to the optimum constrained values of the representation of the projection process.

In still another aspect, the present invention relates to a method for illuminating a mask with a source to project a desired image pattern through a lithographic system onto a photoactive material including the steps of: defining a representation of the mask and a representation of a projection process; obtaining a fractional resist shot noise (FRSN) parameter; determining a first relationship between a first set of optical intensity values and an edge roughness metric based on the FRSN parameter; determining a second relationship between a second set of optical intensity values and a lithographic performance metric; determining a third relationship between a set of polygons in the mask and a mask-writing difficulty metric; imposing a set of metric constraints in accordance with the first, second, and third relationships; setting up an objective function of optimization in accordance with one of the first, second, and third relationships; determining optimum constrained values of the representations of the mask and the projection process in accordance with the set of metric constraints and the objective function of optimization; and outputting the optimum constrained values of the representations of the mask and the projection process.

In still another aspect, the present invention relates to a machine readable storage medium having one or more machine readable program codes stored thereon for causing the machine to perform a method for illuminating a mask with a source to project a desired image pattern through a lithographic system onto a photoactive material including the steps of: defining a representation of the mask; obtaining a fractional resist shot noise (FRSN) parameter; determining a first relationship between a first set of optical intensity values and an edge roughness metric based on the FRSN parameter; determining a second relationship between a second set of optical intensity values and a lithographic performance metric; imposing a set of metric constraints in accordance with one of the first and second relationships; setting up an objective function of optimization in accordance with the remaining of the first and second relationships; determining optimum constrained values of the representation of the mask in accordance with the set of metric constraints and the objective function of optimization; and outputting the optimum constrained values of the representation of the mask.

In still another aspect, the present invention relates to a machine readable storage medium having one or more machine readable program codes stored thereon for causing the machine to perform a method for illuminating a mask with a source to project a desired image pattern through a lithographic system onto a photoactive material including the steps of: defining a representation of the mask; obtaining a fractional resist shot noise (FRSN) parameter; determining a first relationship between a first set of optical intensity values and an edge roughness metric based on the FRSN parameter; determining a second relationship between a second set of optical intensity values and a lithographic performance metric; determining a third relationship between a set of polygons in the mask and a mask-writing difficulty metric; imposing a set of metric constraints in accordance with the first, second, and third relationships; setting up an objective function of optimization in accordance with one of the first, second, and third relationships; determining optimum constrained values of the representation of the mask in accordance with the set of metric constraints and the objective function of optimization; and outputting the optimum constrained values of the representation of the mask.

In still another aspect, the present invention relates to a machine readable storage medium having one or more machine readable program codes stored thereon for causing the machine to perform a method for illuminating a mask with a source to project a desired image pattern through a lithographic system onto a photoactive material including the steps of: defining a representation of the mask and a representation of a projection process; obtaining a fractional resist shot noise (FRSN) parameter; determining a first relationship between a first set of optical intensity values and an edge roughness metric based on the FRSN parameter; determining a second relationship between a second set of optical intensity values and a lithographic performance metric; imposing a set of metric constraints in accordance with one of the first and second relationships; setting up an objective function of optimization in accordance with the remaining of the first and second relationships; determining optimum constrained values of the representations of the mask and the projection process in accordance with the set of metric constraints and the objective function of optimization; and outputting the optimum constrained values of the representations of the mask and the projection process.

In still another aspect, the present invention relates to a machine readable storage medium having one or more machine readable program codes stored thereon for causing the machine to perform a method for illuminating a mask with a source to project a desired image pattern through a lithographic system onto a photoactive material including the steps of: defining a representation of the mask and a representation of a projection process; obtaining a fractional resist shot noise (FRSN) parameter; determining a first relationship between a first set of optical intensity values and an edge roughness metric based on the FRSN parameter; determining a second relationship between a second set of optical intensity values and a lithographic performance metric; determining a third relationship between a set of polygons in the mask and a mask-writing difficulty metric; imposing a set of metric constraints in accordance with the first, second, and third relationships; setting up an objective function of optimization in accordance with one of the first, second, and third relationships; determining optimum constrained values of the representations of the mask and the projection process in accordance with the set of metric constraints and the objective function of optimization; and outputting the optimum constrained values of the representations of the mask and the projection process.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Figure 1:
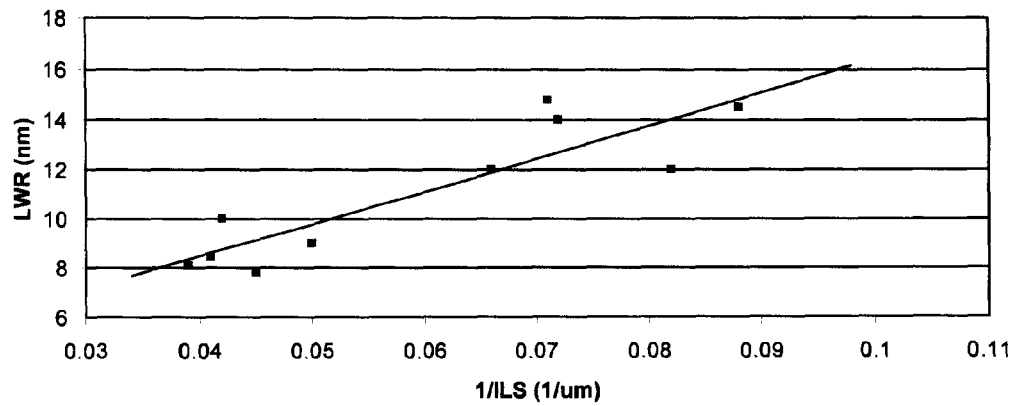
FIG. 1 illustrates how the FRSN can be obtained from a plot of $\sigma_{LER}$ versus the inverse of the ILS values (1/ILS).

It will be appreciated that for simplicity and clarity of illustration, elements shown in the drawings have not necessarily been drawn to scale. For example, the dimensions of some of the elements may be exaggerated relative to other elements for purpose of clarity.

DETAILED DESCRIPTION OF PREFERRED EMBODIMENTS

The various exemplary embodiments in accordance with this invention provide an improvement over conventional methods to reduce image distortions and improve image fidelity. This is accomplished by combining ways to optimize a lithographic image in a conventional SMO method with a new way of adjusting the image intensity to control LER.

As used herein, a "source" or an "illumination source" refers to a device configured to emit radiation for the purpose of lithographic exposure.

As used herein, a "mask" or a "lithography mask" refers to a template used in lithography that allows selective exposure of a photosensitive surface through a patterned layer included therein and having a different transparency than a background layer included therein.

In a conventional SMO method, the image relationships connect the image with standard lithographic metrics which assess sensitivity to defocus, dose control error, etc. In this method, the image intensity is a smoothly varying function due to the finite resolution of the lithographic system. As a result, the contour at the threshold intensity will have a smooth arc. So-called compact process models may be used to capture process effects, in which case the intensity threshold is considered to vary smoothly as a function of the local intensity distribution. Even so, while such compact process models will change the perimeter shape of printed features via changes in the intensity threshold, they will not change its fundamentally smooth character.

However, even though conventional SMO methods can be used to achieve printed features whose shapes are robustly maintained when measured on the scale of the lens resolution, it is increasingly becoming the case that IC yield and performance are being limited by the fine-scale edge roughness of the patterned features. For example, roughness can affect the threshold voltage of circuit transistors, it can alter the effective gate length of transistor devices in a random way, and it can cause changes in the drain-induced barrier lowering.

This invention attempts to improve the LER of the patterned features by using image relationships involving a parameter—fractional resist shot noise (FRSN) which is defined below. The image relationships connect the FRSN to a lithographic metric which involves the transferred pattern, rather than the image itself. The macroscopic image will typically be quite smooth, and the true variability in dose that SMO must optimize against will typically be fairly small, for example, +/−3%. A typical application of a metric for dose sensitivity might say that a particular feature edge should print within 1 nm of target when the dose varies by +/−3%.

The LER phenomenon will also cause the transferred feature to deviate from target, but only by very rapid roughness fluctuations, so that the average or expected edge position will remain within tolerance if conventional SMO methods are used. This macroscopic conformance means that the tolerance on the high frequency roughness can typically be relaxed by comparison with the tolerance on overall edge placement. For example, the LER tolerance might be +/−4 nm instead of +/−1 nm. However, typical values of the FRSN often show that the process is not as well controlled in its microscopic fluctuations as it is the macroscopic exposure dose that the resist receives. In the present invention, "macroscopic" means on the scale of circuit features or larger, while "microscopic" means on the scale of the resist blur distance.

LER of a patterned feature can be characterized as the root mean square of the deviation of a feature edge from a nominal macroscopic contour, according to the following equation:

$$\sigma_{LER} = \text{Sqrt}[<|P(l)-P_0(l)|^2>] \quad (1)$$

$P_0(l)$ denotes the position of a point with x, y coordinates on an arc which runs along the nominal contour (l) at the threshold intensity. The nominal contour can be obtained through simulation or by fitting a smooth contour during the measurement, as known in the art. Because of line edge roughness, the actual contour will generally be randomly offset from the nominal contour. The position of the point on the actual contour corresponding with $P_0(l)$ is denoted $P(l)$. The square of the magnitude of the offset between $P(l)$ and $P_0(l)$ is given by $|P(l)-P_0(l)|^2$. To calculate $\sigma_{LER}$, ensemble average of the squared offset, as denoted by $<|P(l)-P_0(l)|^2>$, is first taken. The square root (Sqrt) of the ensemble average then gives $\sigma_{LER}$.

In a paper published by Gregg M. Gallatin (Gregg M. Gallatin, "Resist Blur and Line Edge Roughness", Proceedings of SPIE-Optical Microlithography XVIII, Vol. 5754, 38-52), $\sigma_{LER}$ has been related to the optical intensity at an edge of a printed feature according to the following equation:

$$\sigma_{LER} \approx \left(\frac{i_{edge}}{\frac{\partial i_{edge}}{\partial x}}\right)\sqrt{\frac{T}{\varepsilon E_{edge} 4R_{PEB}^3}} \quad \text{i. (2)}$$

wherein $i_{edge}$ is the optical intensity at a given position of the edge of the printed feature, T is the thickness of the resist, $\varepsilon$ is the quantum efficiency of acid release, $E_{edge}$ is the local dose at the edge, $$V_D = \frac{4\pi R_{PEB}^3}{3} \square 4R_{PEB}^3$$

is the volume of the deprotection blur, and $R_{PEB}$ is the resist diffusion blur.

Let $.N = \varepsilon E_0 fV/T$ Then, the above equation can be rewritten as:

$$\sigma_{LER} \approx \frac{i_{edge}}{\frac{\partial i_{edge}}{\partial x}} \cdot \frac{\sqrt{N}}{N} = \frac{\frac{\sqrt{N}}{N}}{\frac{\partial \log(i_{edge})}{\partial x}} \quad \text{ii. (3)}$$

wherein $i_{edge}$ is the optical intensity at a given position of the edge of the printed feature, N is the number of photoacid molecules activated within the resist blur resolution volume, and $$\frac{\partial \log(i_{edge})}{\partial x}$$

is the image log slope (ILS) at this position.

Importantly, as shown in Eq. (3), $\sigma_{LER}$ is inversely proportional to ILS. Thus, increasing ILS will reduce the LER of a printed feature.

In the present invention, $\sqrt{N}/N$ is defined as FRSN. Based on Eq. (3), FRSN is related to $\sigma_{LER}$ according to the following equation:

$$FRSN = \frac{\sqrt{N}}{N} = \sigma_{LER} \cdot \frac{\partial \log(i_{edge})}{\partial x} = \sigma_{LER} \cdot ILS \quad \text{i. (4)}$$

FRSN can be obtained from experimental data using Equation (4). In particular, $\sigma_{LER}$ can be determined from printed images of a test pattern. For example, $\sigma_{LER}$ can be obtained by using a scanning electron microscope (SEM) to measure a rough perimeter of a sample edge of a test pattern so as to approximate the ensemble average $<|P(l)-P_0(l)|^2>$. The position of a reference edge $P_0(l)$ may be obtained by smoothing the position measured along the rough edge over a distance comparable to the lens resolution, or by fitting a smooth contour of a known image. $\sigma_{LER}$ is then calculated from the ensemble average according to Eq. (1).

One may wish to measure $\sigma_{LER}$ to within a certain relative accuracy. In order to achieve the desired relative accuracy, the total length of the sample edge of the test pattern should be sufficiently long. In one embodiment, $\sigma_{LER}$ is measured to about 3% relative accuracy. In this case, the total sample edge length should be about 1000 times the size of the resist blur resolution, e.g., a total sample length of about 10 microns might be used. The image used to print the test pattern may be determined along with their ILS values by standard image calculation methods, as known to the skilled in the art. One may form the total sample population using test patterns whose images have a diverse set of ILS values. As shown in FIG. 1, a plot of $\sigma_{LER}$ versus the inverse of the ILS values (1/ILS) can be obtained based on the $\sigma_{LER}$ values and the ILS values as measured over such a sample population. When a line is fit to the plot, the FRSN is the slope of the fitted line, according to the following equation derived from Eq. (4):

$$\sigma_{LER} = FRSN \times 1/ILS \quad (5)$$

The FRSN is different from the macroscopic dose control. An error in macroscopic dose often contributes to CD errors, while the FRSN represents a resist fluctuation at approximately the molecular scale of the resist during the exposure process. The FRSN often contributes to the LER of the resist pattern. In addition, the FRSN is usually several times larger than the macroscopic level dose control achieved in the process.

Figure 2:
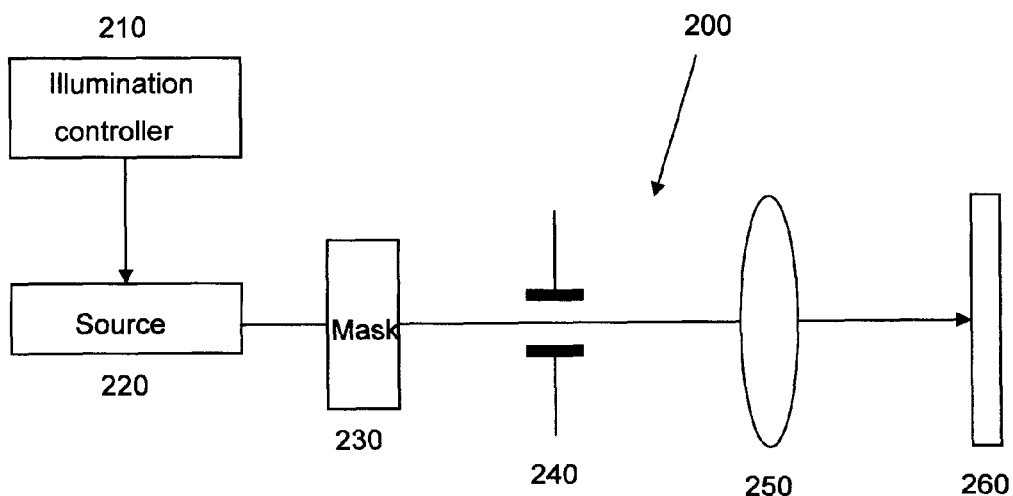
FIG. 2 illustrates components of a conventional projection lithographic system.

Components of a conventional projection lithographic system 200 are shown in FIG. 2. An illumination controller 210 drives an illumination source 220 to illuminate a mask 230. The mask 230 includes pattern features that act to diffract the illuminating radiation through a pupil 240 which may control directional extent of the illumination, and through a lens 250 onto an imaging plane such as a semiconductor wafer 260. The wafer 260 typically includes a photoactive material such as a photoresist layer. When the photoresist layer is exposed to the projected image pattern, a chemical reaction occurs in the exposed areas of the photoresist layer. After the photoresist is developed, a pattern forms in the photoresist layer which closely conforms to the desired image pattern. The pattern in the photoresist layer is then transferred to the semiconductor wafer 260. The pattern features on the mask 230 acts as a diffracting structure analogous to a diffraction grating. Increased precision in the formed circuitry depends on the intensities of the illumination that strikes different positions of the photoresist layer on the semiconductor wafer 260.

Figure 3:
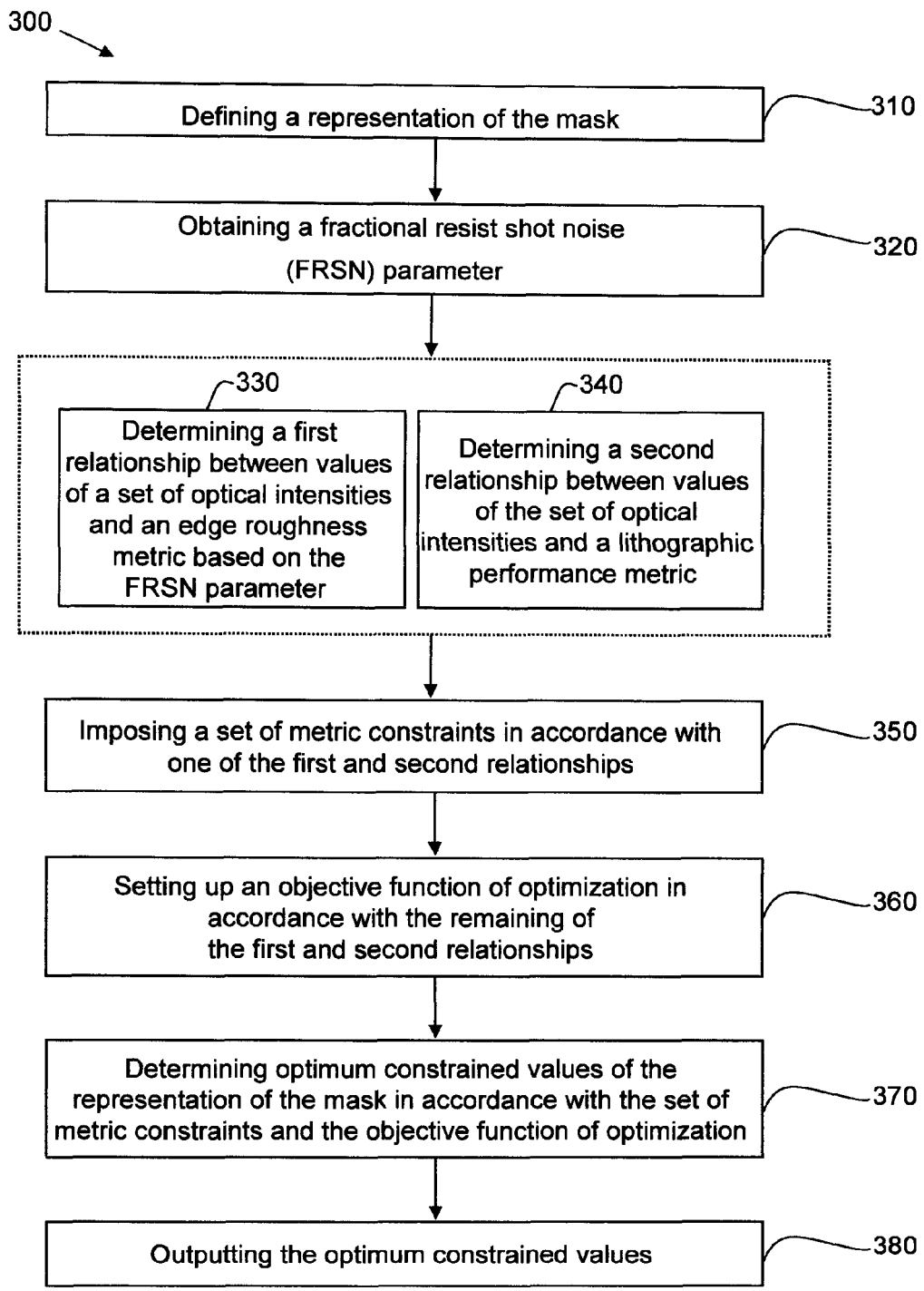
FIG. 3 is a flow chart illustrating an embodiment of a method for illuminating a mask with a source to project a desired image pattern through a lithographic system onto a photoactive material according to the present invention.

One embodiment of a method for illuminating a mask with a source to project a desired image pattern through a lithographic system onto a photoactive material according to the present invention is illustrated in FIG. 3. The method 300 achieves improved ILS and LER by simultaneously choosing parameters of mask transmission features in a lithographic imaging system so that features of the projected image are optimized.

Figure 4:
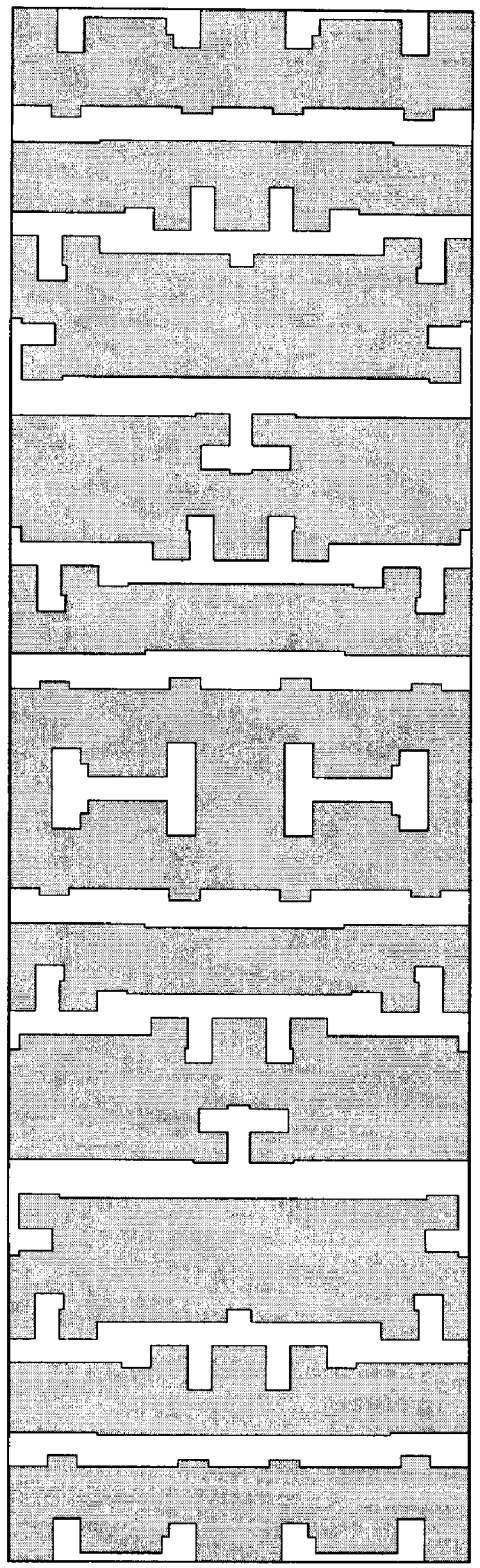
FIG. 4 shows a representative lithographic mask layout, according to an embodiment of the present invention.

Referring to FIG. 3, in step 310, a representation of the mask is defined. In one embodiment, the representation is the positions of the edges and/or corners of a set of polygons in the mask. FIG. 4 shows a representative lithographic mask layout 400, according to an embodiment of the present invention. The lithographic mask layout 400 includes a number of polygons. Each polygon has a number of edges and corners. The positions of the edges and the corners are indicated by using x- and y-coordinates. For example, a x-coordinate can be used to indicate the position of a vertical edge and a y-coordinate can be used to indicate the position of a horizontal edge. For corners, x, y coordinates are used to indicate the position of a corner.

The representation of the mask may also include the transmission coefficients of the polygons as determined by the mask technology. A mask is defined by the edges and/or corners of the polygons as well as the transmission coefficients of the polygons. For example, so-called binary masks may be composed of polygons with a transmission coefficient of 1 within a background that may be taken to have a transmission coefficient of 0, or alternatively, a known small value. So-called chromeless masks may be composed of polygons with a transmission coefficient of −1 formed within a background with a transmission coefficient of 1, or polygons with a transmission coefficient of 1 formed within a background with a transmission coefficient of −1.

In another embodiment, the representation is a set of diffraction order weights which represent the amplitude of the light which is diffracted by the mask and passes through the pupil of the lithographic system. Diffraction orders represent the 2D Fourier transform of the polygons under periodic boundary conditions, with the (n, m) order being diffracted into frequency space in a direction (n*λ/Px, m*λ/Py). λ is the wavelength. Px and Py are the periods assumed for the boundaries of the mask design field. All diffraction orders whose directions can be collected within the numerical aperture (NA) of the lens are included in the diffraction order weight representation.

Figure 5:
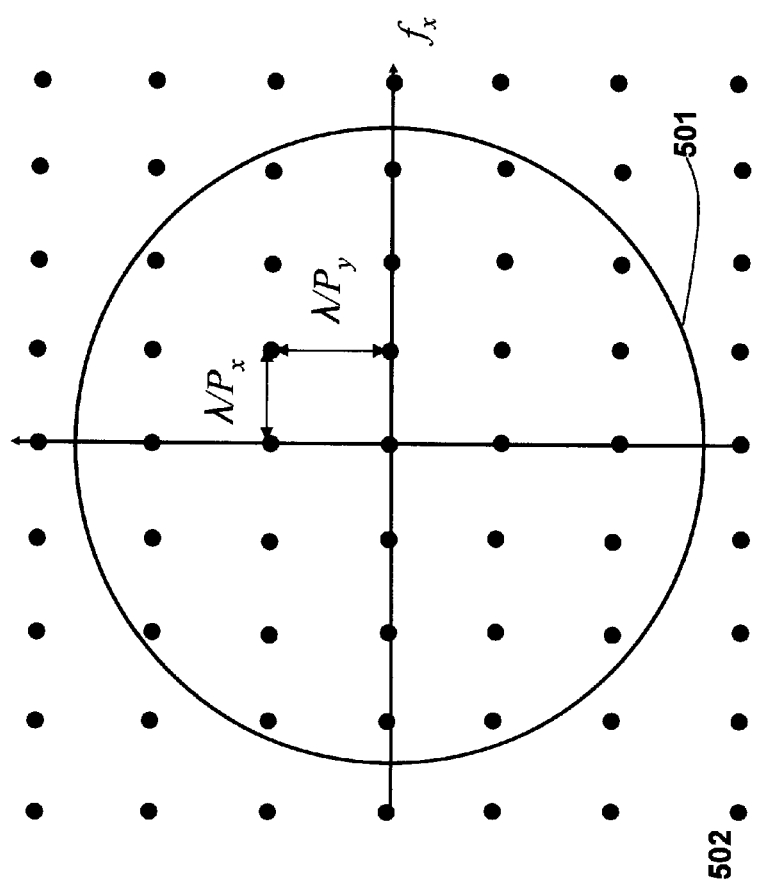
FIG. 5 illustrates a set of diffraction order weights which represent the amplitude of the light which is diffracted by a mask and passes through the pupil of a lithographic system.

As shown in FIG. 5, the lens numerical aperture 501 almost always has a circular shape, and the diffraction orders such as 502 propagate in a regularly spaced array of directions in the usual case where periodic boundary conditions are imposed. Defining these directions more precisely, the horizontal axis $f_x$ is considered to represent the sine of the angle of propagation away from the y,z plane, or equivalently the cosine of the angle projected along the x axis. Similarly, $f_y$ represents the sine of the propagation angle relative to the x,z plane. In this direction-space diagram the mask face is parallel to the x,y plane, and the optical axis lies along z. When the mask is illuminated perpendicular to the x,y plane, i.e. from the z direction, only diffraction orders whose direction lies within the circular NA 501 are collected by the lens, and so can propagate to the wafer. Typically the source can be illuminated from many other directions besides the z direction. For example, the source can be illuminated from all directions within a circular dimensional domain of the same radius as the lens NA 501. In that case the collected diffraction orders are those whose directions fall within a circle of radius equal to twice that of lens NA 501, since a tilt in the illumination produces a corresponding tilt in the diffracted directions. In general, these collected diffraction orders constitute a useful representation of that portion of the mask content which is capable of influencing the wafer image.

Bitmap masks are yet another possible mask representation, where the bitmap values represent the transmission of small mask rectangles as laid out on a grid.

In step 320, a FRSN parameter is obtained. As discussed above, the FRSN can be obtained experimentally based on the $\sigma_{LER}$ values and the ILS values as measured over a sample population of test patterns. The FRSN is a microscopic representation of resist fluctuation during exposure. At the threshold intensity, the FRSN is a constant for a given resist.

In step 330, a first relationship between a first set of optical intensity values and an edge roughness metric is determined based on the FRSN parameter. The first set of optical intensity values are chosen based on the desired properties of the image intensity distribution. The desired properties of the image intensity distribution are specified using discrete sample points whose density sufficiently exceeds the lens resolution (0.25×λ/NA) such that the sampled intensities adequately represent the character of the image. For example, certain classes of sample points can be used to map out the nominally bright and dark regions of the image, while other classes of sample points define the boundaries of an acceptable band of positions in which each feature edge can be allowed to print (tolerance band).

Figure 6:
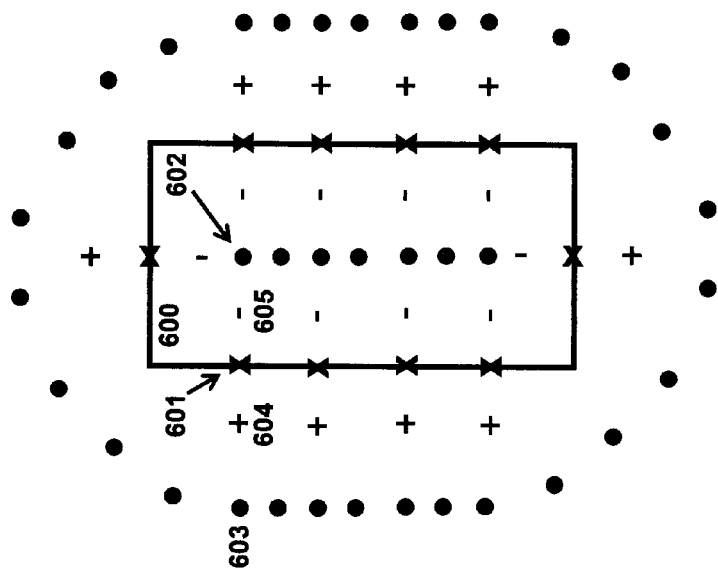
FIG. 6 illustrates how lithographic performance metrics can be related to a sampled set of intensity values in an image.

FIG. 6 illustrates an approach to selecting sample points, according to an embodiment of the invention. The bright sample points can include edge bright points such as 601, which sample the intensity contour where the edges of the developed photoresist are intended to be formed in order to reproduce the circuit design. This resist edge is also referred to as the target contour. Other kinds of sample points may be included, such as bright interior points 602, which sample the interior of bright regions such as 600 where the resist is to be fully exposed, and dark perimeter points 603, which are spaced away from edge bright points 601 towards the interior of dark image regions. Additional dark sample points may be deployed further into the interior of dark portions of the image, for example, outside the range shown in FIG. 6. The edge bright sample points may be spaced at, for example, 0.25×λ/NA as traced along the target contour of exposed region 600. The dark perimeter points can be defined as points located at a distance of, for example, 0.2×λ/NA outward from the edge bright contour points toward the dark region. The dark interior points are grid points in the dark region that are further away from the edge-bright contour than the dark perimeter points, for example they may typically be located at a distance of about 0.25×λ/NA from the dark perimeter points, in directions further into the interior of the dark region.

The distance between the two points defining a tolerance band (on the opposite sides of a feature edge) is L. For simplicity we may consider that the allowed tolerance on either side of the feature edge is L/2, though asymmetric tolerances can also be employed. The optical intensities at the two points are $i^+$ and $i^-$. ILS is related to the set of intensity values at the boundaries of an acceptable band of positions in which each feature edge can be allowed to print ($i^+$ and $i^-$) by the following equation:

$$ILS = \frac{i^+ - i^-}{\frac{i^+ + i^-}{2}} \cdot \frac{1}{L} \quad (6)$$

wherein $i^+$ and $i^-$ are the intensities of the two corresponding points on the opposite sides of a feature edge and L is the distance between the two points.

An example of the edge roughness metric is $\sigma_{LER}$. $\sigma_{LER}$ is related to ILS according to Eq. (4). Since the ILS value at each sample point is related to a set of optical intensities $i^+$ and $i^-$ based on Eq. (6), a relationship between the set of intensities $i^+$ and $i^-$ and $\sigma_{LER}$ then can be determined based on the FRSN parameter according to Eq. (4).

A second relationship between a second set of optical intensity values and a lithographic performance metric is determined in step 340. Examples of the lithographic performance metric suitable for the present invention include, but are not limited to, exposure latitude (EL) metric, process window metric, edge placement error (EPE) metric, and depth of focus (DOF) metric. EL is the extent to which a resist can be over- or underexposed but still achieve an acceptable CD result. Process window is a metric obtained by plotting contours corresponding to various specification limits as a function of exposure dose and focus. One simple process window, called CD process window, is a contour plot of the high and low CD specifications as a function of exposure dose and focus. Often, several process windows are plotted together to determine the overlap of the windows. EPE is a metric which can be obtained by simulating the distance from the nominal contour to the target. DOF is the total range of focus which can be tolerated, that is, the range of focus that keeps the resulting printed feature within a variety of specifications, e.g., exposure latitude.

In general, all of these lithographic performance metrics can be related with simple calculations to the intensity distribution in the image, and more specifically to a sampled set of intensity values in the image. Referring to FIG. 6, this sampling can be carried out by first distributing edge sample points 601 within a simulation field at positions along the target contour that are more finely spaced than the resolution-limited spatial variability of the image. These are referred to as a first group of sample points. In one embodiment, the sample points are distributed at positions with a spacing of about 0.25×λ/NA or less along the target contour. A matching group of sample points 604 can be deployed which are offset away from the positions along the contour of the first group of sample points in the directly outward direction into the dark part of the image, with the offset being set equal to the tolerance on allowed variation in the printed macroscopic position of the printed pattern. (Points 604 are displaced inward if the mask features are dark in a bright background.) Likewise, a third group of sample points 605 can be deployed with an offset from the target contour into the bright region of the image equal to the tolerance in allowed variation in the printed macroscopic position of the printed pattern. The exposure latitude at a particular sample point along the contour is the difference in the intensities that are present at the inward-offset and outward-offset sample points, expressed as a percentage.

In particular, exposure latitude (EL) at a target-contour sample point can be related to the sampled intensities by subtracting the intensity at whichever sample point is offset into the nominally darker side of the nominal image from the intensity at the sample point offset to the nominally brighter side. These dark-side-offset and bright-side-offset sample points are illustrated in FIG. 6 as sample points 604 and 605, respectively. Sample points of either of these kinds are also referred to as edge tolerance sample points. In one embodiment, the overall exposure latitude metric is calculated as the smallest such exposure latitude occurring anywhere along the target contour. In another embodiment, the overall exposure latitude metric is calculated by subtracting the largest intensity occurring anywhere among the dark-side-offset sample points from the smallest intensity occurring anywhere among the bright-side-offset points. In this embodiment the exposure latitude represents the common process window, which may be calculated across a focal range corresponding to the desired focal range of the lithographic process. In yet another embodiment, the process window metric is obtained by summing the exposure latitudes over all planes within the focal range, where the focal range excludes all intensities which do not fall within the in-focus exposure latitude. This metric is also referred to as the common window, or as the integrated common window.

Figure 7:
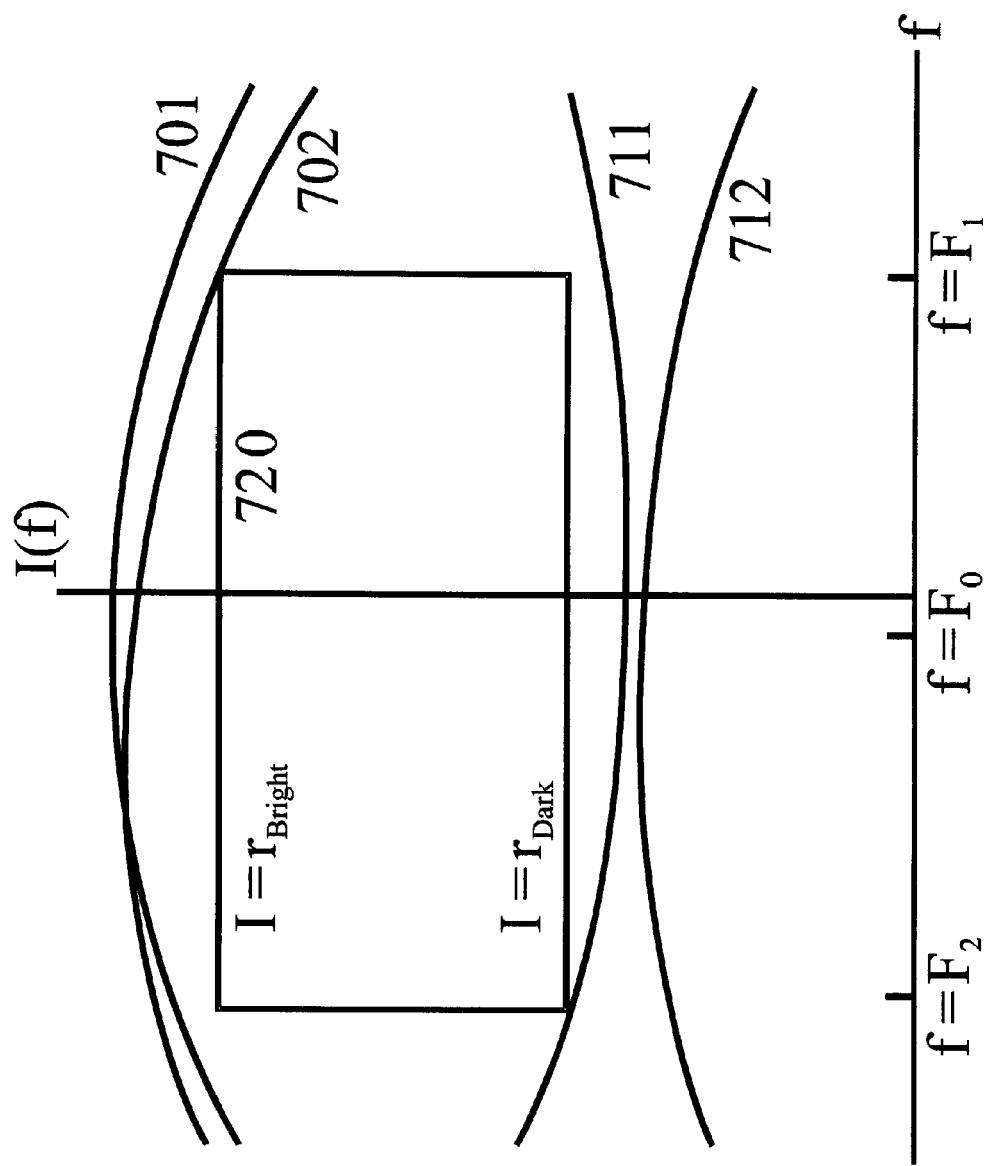
FIG. 7 illustrates the determination of the common window metric from the intensities at dark-side-offset and bright-side-offset sample points.

FIG. 7 illustrates the determination of the common window metric from the intensities at dark-side-offset and bright-side-offset sample points, like those shown in FIG. 6 (points 604 and 605 respectively). For notational convenience we can use the expression $I_e(n,f)$ to denote the intensity at the nth edge sample point (such as 601) when the lens is defocused to position f. Note that these intensities are determined by the mask representation from relationships that are well known in the art, for example by convolutions with imaging kernels. Similarly, the intensities at the associated dark-side-offset and bright-side-offset sample points (such as 604 and 605) can be written as $I_d(n,f)$ and $I_b(n,f)$, respectively. The common window may then be calculated as $$CW = (r_{Bright} - r_{Dark})/\langle I_e(n, F_0) \rangle \quad (7)$$

where CW is the common window;
$r_{Bright} = \text{Min}[I_b(n,f)]$;
$r_{Dark} = \text{Max}[I_d(n,f)]$.

Since the intensities $I_d(n,f)$ and $I_b(n,f)$ are determined by the mask, these equations constitute a relationship between the common window metric and the mask representation. The Minimization and the Maximization in these equations extend over all values of n, and over all values of defocus f that fall within the desired focal range of the exposure process, which we can express as $F_2 < f < F_1$. In practice f may be sampled at a discrete set of planes. The average of $F_1$ and $F_2$ is the center of focus, which is typically considered the plane of best focus; we can write this position of best focus as $f=F_0$. The quantity $<I_e(n,F_0)>$ is used to convert CW into the conventional fractional or percentage metric; it is defined as the average of $I_e(n,F_0)$ taken over all n. One may optionally re-scale the CW by the focal range included, i.e. one may alternatively define CW as $$CW=(F_1-F_2)*(r_{Bright}-r_{Dark})/<I_e(n,F_0)> \qquad (8)$$

Common window is often considered to be a dose window rather than an intensity window, but when expressed in percentage units the two are essentially equivalent.

Referring to FIG. 7, curves 701 and 702 plot as a function of defocus the intensity at two different bright-side-offset sample points, which may be regarded for purposes of discussion as the n=1 and n=2 bright-side-offset sample points. Only two such curves are included, but usually many more would be present, as determined for example by application of the sample point spacing rules described above. Curves 711 and 712 plot the intensities of the dark-side-offset sample points associated with edge sample points n=1 and n=2. Box 720 represents the common process window, with the common process window metric being the area of box 720, as normalized by the average intensity along the target edge contour in focal plane $F_0$. Common process window 720 represents the largest box spanning the $F_1$-to-$F_2$ focal range that can fit between the intensity curves at the edge tolerance sample points. The print threshold dose and the lens defocus can be shifted to any point within this box without causing the position of the thresholded resist contour to drift out of tolerance. The upper edge of box 720 is defined to have vertical position $r_{Bright}$, and the lower edge to have position $r_{Dark}$.

Optionally, but not necessarily, a third relationship between a set of polygons in the mask and a mask-writing difficulty metric is determined. The set of polygons in the mask are preferably the shapes of mask openings that will be formed in a background film on the mask substrate, or alternatively, the shapes of islands of material that are left when the remainder of the background film is removed. Examples of the mask-writing difficulty metric include, but are not limited to, mask manufacturability metrics that represent inadequate separation between features, or that represent features which are not kept distinct (i.e. features whose edges cross).

Such manufacturability metrics are preferably smooth functions of the mask geometries, with the function values chosen to correlate monotonically with particular dimensional attributes that the shapes must satisfy to be manufacturable. For example, these dimensional requirements may be mask ground rules supplied by the mask manufacturer. The value of the metrics can then be constrained to achieve suitable levels for manufacturability. Alternatively, a particular manufacturability metric may be optimized as an objective. In other embodiments, the objective may be a weighted sum of more than one manufacturability metric, or the objective may be the RMS value of the metrics, or alternatively, the objective may be to maximize the particular manufacturability metric which has the smallest (i.e. worst-case) value. As yet another alternative, a combined manufacturability metric, or a worst-case metric, may serve as an overall metric to be constrained. In some embodiments, the manufacturability metrics may take the form of penalty functions that should be held below a threshold penalty, or that should be minimized. These penalty metrics may be converted to metrics that should be maximized or raised above a threshold by reversing the sign of the penalty. In general, the smooth functions involved constitute a relationship between the mask shapes and a mask manufacturability metric.

Separate manufacturability metrics may conveniently be calculated for all pairs of edges, or for all pairs of edges that are in close proximity to each other, such as those pairs of edges whose closest separation is comparable to the resolution of the mask-writing process, or is smaller. In many cases the mask manufacturing process only permits fabrication of mask features whose shapes are polygons with edges that have specific allowed orientations relative to the edges of the mask substrate itself, such as orientations of 0 degrees and 90 degrees (so-called Manhattan masks), or such as 0, 90, 45, or 135 degrees.

Metrics that are penalties calculated for pairs of edges may take the form of functions that have values at or near zero when the two edges in the pair are well separated, so that the penalty metric goes to zero when the two edges do not interfere with each other's manufacture. Further, such a penalty function may, for example, rise to a value of 1 under conditions where the two edges are strongly interfering, such as when the edges cross at their midpoints, or as another example in cases where the two edges are parallel, are fully overlapped, and have 0 separation between them.

In many cases manufacturability metrics may conveniently be constructed as products of sub-metrics. For example, if two conditions must be triggered before a pair of edges will interfere with each other's manufacture, for example a first condition involving the x coordinates of points in the two edges, and a second condition involving the y coordinates of points in the two edges, then the two conditions can usefully be represented as two sub-metrics (later multiplied) that correspond to the two conditions. If either one of the conditions is not met, causing the corresponding sub-metric to have a value near zero, the metric formed as a product of the sub-metrics will also have a value near zero. Only if both conditions are met will the overall metric have an appreciable value, since each sub-metric will then have a value of order 1. In such a case the metric will properly indicate that the pair of edges is difficult to manufacture.

An example of a useful manufacturability metric is a crossing penalty metric. When applied to a pair of non-parallel edges, this metric represents in a smooth way the degree to which the edges are in a state of crossing, or near-crossing. A constraint may be imposed on every pair of proximate edges (i.e. edges that approximately neighbor each other) requiring that the crossing penalty metric be kept safely below the level representing a truly crossed condition. In the case where the mask is Manhattan, the metric can be applied to edge pairs in which one edge is horizontal and the other vertical. The crossing penalty can take the form of a product of two sub-metrics; one sub-metric indicating whether the x-coordinate of the edge that is vertical crosses the span between the x coordinates of the two endpoints of the horizontal edge, and a second sub-metric which indicates whether the y coordinate of the horizontal edge crosses in between the y coordinates of the two endpoints of the vertical edge. Each sub-metric can then be written in the form $P_S(q_0;q_1,q_2)$, where $q_0$ represents the location of one edge along an axis perpendicular to its orientation, and where $q_1$ and $q_2$ represent the coordinates along this same axis of the two endpoints of the other orthogonally oriented edge. $P_S$ may be any function that is close to zero when $q_0$ is far to one side (either side) of $q_1$ and $q_2$, and that rises to a substantial value as $q_0$ passes between $q_1$ and $q_2$. The overall product of the two $P_S$ sub-metrics for the x and y coordinates can then only achieve a large value when the two edges are crossed in both coordinates, i.e. are truly crossed.

For example, we may set $$P_S(q_0;q_1;q_2)=\text{Log}_2[1+(\text{Sqrt}[2]-1)^{\{([q_0-q_1]*[q_0-q_2])/(e[q_2-q_1])^2\}}] \quad (9)$$

In this form the function $P_S$ takes on the value 1 when $q_0$ just crosses either $q_1$ or $q_2$ (i.e. when $q_0$ is equal to one of them), and rises to a larger value when $q_0$ is positioned in between $q_1$ and $q_2$. When $q_0$ is well distant from $q_1$ and $q_2$ on either side, $P_S$ drops smoothly to zero. $P_S$ rises as $q_0$ approaches $q_1$ or $q_2$ from either side, which causes the geometric mean of $[q_0-q_1]/|q_2-q_1|$ and $[q_0-q_2]/|q_2-q_1|$ to decrease. When this geometric mean drops to a value of e, the increasing $P_S$ function reaches ½. Parameter e thus controls the steepness in the rise of $P_S$ as the edges come close to crossing (which occurs when $P_S$ reaches 1). Typically e will be a small quantity such as 0.1, so that $P_S$ only rises to a value of 0.5 when $q_0$ comes quite close to $q_1$ or $q_2$. Other forms of $P_S$ use an absolute distance parameter to control the steepness of $P_S$, such as a distance of 10 nm. Other suitable functions for metric and sub-metric components like $P_S$ take the form of piecewise smooth polynomials.

Once these two relationships are determined, a set of metric constraints in accordance with one of the first and second is imposed (step 350). In one embodiment, at least one of the set of metric constraints is imposed as a penalty term in the objective function of optimization. The violation of the constraints is reflected into the objective function as the penalty term. For example, one can set the process window as the objective function of optimization and the ILS constraint as the penalty in the objective function. In another embodiment, the set of constraints are set as the constraints in optimization. This functionality can be carried out using standard nonlinear optimization software, by specifying as an optimization constraint that the lithographic metric must be held above a desired quality level.

The relationship used to determine the set of metric constraints may be any one of the first and second relationships. After the set of metric constraints are determined, an objective function of optimization is set up in accordance with the remaining of these two relationships which is not used (step 360). For example, if the first relationship is used to determine the set of metric constraints, then the objective function of optimization is set up using the second relationship. Conversely, if the second relationship is used to determine the set of metric constraints, then the first relationship is used to set up the objective function of optimization.

In one embodiment, when the third relationship between a set of polygons in the mask and a mask-writing difficulty metric is determined, a set of metric constraints in accordance with two of the first, second, and third relationships is imposed. In one example, at least one of the set of metric constraints is imposed as a penalty term in the objective function of optimization. The violation of the constraints is reflected into the objective function as the penalty term. For example, one can set the process window as the objective function of optimization and the ILS constraint as the penalty in the objective function, while leaving manufacturability as the constraints in the optimization. In another embodiment, the set of constraints are set as the constraints in optimization. This functionality can be carried out using standard nonlinear optimization software, by specifying as an optimization constraint that the lithographic metric must be held above a desired quality level.

The two relationships used to determine the set of metric constraints may be any two of the first, second, and third relationships. After the set of metric constraints are determined, an objective function of optimization is set up in accordance with the remaining of the three relationships which is not used. For example, if the first and second relationships are used to determine the set of metric constraints, then the objective function of optimization is set up using the third relationship. If the second and third relationships are used to determine the set of metric constraints, then the first relationship is used to set up the objective function of optimization. Finally, if the set of metric constraints are determined based on the first and third relationships, then the second relationship is used to set up the objective function of optimization.

In another embodiment, when the third relationship between a set of polygons in the mask and a mask-writing difficulty metric is determined, a set of metric constraints is imposed in accordance with the first, second, and third relationships, i.e., the set of metric constraints is imposed according to all three relationships. After the set of metric constraints are determined, an objective function of optimization is set up in accordance with one of the three relationships. The relationship used to set up the objective function can be any one of the three relationships.

The objective function of optimization in step 360 may be any standard lithographic metric, such as the exposure latitude or process window metrics. A standard optimization code may be used to specify that the objective of the optimization is to maximize the desired quality metric.

This procedure may be summarized algebraically in the following fashion. In one embodiment, we let $a_i(m)$ denote in an abstract way a manufacturability metric, for example a metric which describes the mutual fabricability of a particular pair of edges. We further assume that this metric is scaled such that the pair of edges becomes manufacturable in respect to the metric whenever $a_i(m)$ is positive. The argument m denotes the full set of variable values in the mask representation. The relationship between each $a_i$ and the m variables might for example be defined by the $P_S$ functions described above. The subscript i indicates that this particular metric arises in the ith element of a constraint list which would typically have many members. For notational convenience we can write the entire list of such constraints as a single expression, namely $$a_i(m)>0$$

This expression is understood to apply for each value of i.

In a similar way we let $b_j(m)$ denote a lithographic performance metric which may be evaluated at some point in the image; for example, $b_j(m)$ might represent the exposure latitude evaluated at a particular sample point associated with the jth constraint (which might be a bright edge sample point), or $b_j(m)$ might represent the residual intensity in a nominally dark region of the image (where the sample point associated with the jth constraint might be a dark interior sample point). Different lithographic performance metrics may be applied at different values of j. A lithographic performance metric will typically depend on the image intensities which in turn depend on the mask; thus each metric $b_j(m)$ constitutes a relationship between the metric and the values of the mask representation.

A similar notation can be applied to ILS. For example, we can let $c_k(m)$ denote the ILS value obtained at the sample point associated with the kth constraint. This sample point may be a bright edge sample point. $c_k(m)$ represents a relationship between the ILS values and (via the image intensities) the values m of the mask representation, in the manner discussed above. When defining $c_k(m)$ we can further subtract from ILS the quantity $FRSN/\sigma_{LER,Tol}$, where $\sigma_{LER,Tol}$ represents a tolerance on allowed LER (which may optionally be different at different values of k). In this way our LER requirement can be expressed as $$c_k(m) > 0$$

We next consider that while a, b, and c may be defined in respect to many particular aspects of the image or mask, such as at many different sample points, it is possible in each case to define single overall metrics A, B, and C which represent the overall quality attained by the image or mask in respect to the metric type. For example, while $a_i(m) > 0$ may represent a requirement that the ith pair of edges be mutually manufacturable, A(m) may represent the worst-case manufacturability level arising amongst all different pairs of edges in the mask. Alternatively, A(m) may represent the average manufacturability level, or the RMS manufacturability level. Similarly, B(m) might denote the common window achieved across all bright edge sample points, and C(m) might represent the worst-case ILS value arising anywhere in the image, as normalized by $\sigma_{LER,Tol}$.

Then, in accordance with step 350 of the invention, we may optionally form metric constraints using, for example, the two sets of relationships a and b. According to step 360, we may then define C as the objective to be optimized in the lithographic process. When steps 350 and 360 are completed in this way, we next (in step 370) determine optimum values for the mask variables m by solving the optimization problem i. Maximize C(m)

subject to:

ii. $a_i(m) > 0$ iii. $b_j(m) > 0$

Note that separate constraints do not necessarily have to be defined for multiple aspects of the image, such as at multiple sample points, though this would be a common choice. One may instead, for example, employ a single constraint B(m)>0, i.e.

i. Maximize C(m)

subject to:

ii. $a_i(m) > 0$ iii. $b_j(m) > 0$ where B might represent common window. Note that if a metric such as B is a worst case metric it may be defined using auxiliary constraints.

Other choices for the constrained metrics and objective can be made in steps 350 and 360 as well. For example i. Maximize A(m)

subject to:

ii. $c_k(m) > 0$ iii. $b_j(m) > 0$ or iv. Maximize B(m)

subject to:

v. $c_k(m) > 0$ vi. $a_i(m) > 0$

The above two approaches differ in the choice of the two constraint relationships that is made in step 350.

It is also possible to simultaneously employ an objective and constraints of the same general type; for example i. Maximize B(m)

subject to:

ii. $a_i(m) > 0$ iii. $b_j(m) > 0$ iv. $c_k(m) > 0$

In this case, B might represent common window, while the various $b_h(m)$ might include, for example, constraints on exposure latitude or residual dark intensity at different sample points.

In some embodiments the invention need not employ relationships from all three categories a, b, and c. For example, one may instead determine the optimum constrained values for the mask representation by solving the optimization problem i. Maximize C(m)

subject to:

ii. $b_j(m) > 0$

The optimum constrained values of the representation of the mask are determined based on the set of metric constraints and the objective function of optimization in step 380. Selected nonlinear optimizer/solver, e.g., IPOPT (Interior Point OPTimization) or Augmented Lagrangian code, will solve the nonlinear optimization problem defined by the set of metric constraints and the objective function. The optimization variables of such a nonlinear optimization problem are the representations of the mask. The nonlinear optimizer/solver will output the optimum values of the representations of the mask.

Once the optimum constrained values of the representation of the mask are determined, they are output (step 380). For instance, the optimum constrained values may be displayed on a display device of a computer for viewing by a user. In another example, the optimum constrained values may be printed out on a paper. In still another example, the optimum constrained values may be output to a mask design database to be used to design a mask.

The method 300 of FIG. 3, including at least steps 310, 320, 330, 340, 350, 360, 370 and 380, may be performed by one or more computer programs. These one or more computer programs may be executed by one or more processors of one or more computer devices, as can be appreciated by those of ordinary skill within the art.

Ultimately, the mask may have its design optimized based on the optimum constrained values of the selected representation of the mask so as to achieve desired ILS and LER. In this respect, steps 310, 320, 330, 340, 350, 360, 370 and 380 may be iteratively performed until a mask design having desired ILS and LER is achieved. Embodiments of the invention are not limited to the specific manner by which each of the steps 310, 320, 330, 340, 350, 360, 370 and 380 is performed.

Once the optimum constrained values of the selected representation of the mask are output, the mask may be fabricated according to the optimum constrained values. In addition, the method may further include projecting the mask through the lithographic system onto the photoactive material to create a pattern in the photoactive material which closely conforms to the desired image pattern.

Figure 8:
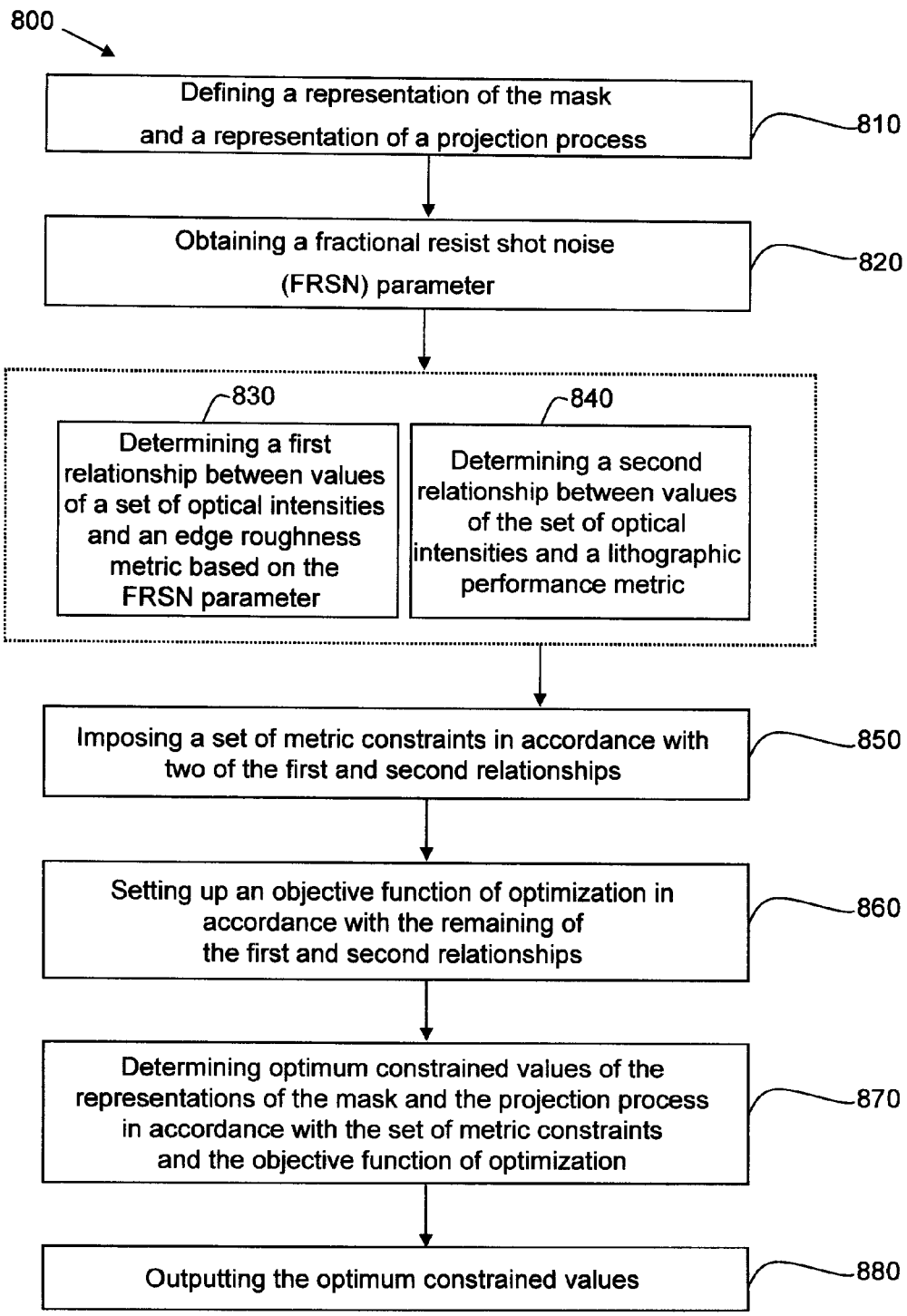
FIG. 8 is a flow chart illustrating another embodiment of a method of illuminating a mask with a source to project a desired image pattern through a lithographic system onto a photoactive material according to the present invention.

Another embodiment of a method of illuminating a mask with a source to project a desired image pattern through a lithographic system onto a photoactive material according to the present invention is illustrated in FIG. 8. The method 800 achieves improved ILS and LER by simultaneously choosing parameters of source and mask transmission features in a lithographic imaging system so that features of the projected image are optimized.

Referring to FIG. 8, in step 810, a representation of the mask and a representation of a projection process are defined. In one embodiment, the representation is a set of polygons in the mask. The transmission coefficients of the polygons are determined by the mask technology. A mask is defined by the edges and/or corners of the polygons as well as the transmission coefficients of the polygons, as described above. In another embodiment, the representation is a set of diffraction order weights which represent the light diffracted by the mask and passes through the pupil of the lithographic system. Bitmap masks represent another possible representation, where the bitmap values represent the transmission of small mask rectangles as laid out on a grid. One example of the representation of the projection process suitable for the present invention is a set of source pixel intensities.

Steps 820 to 860 of the method 800 are the same as steps 320 to 360 of the method 300 respectively as described above in details. Similarly, the relationship used to determine the set of metric constraints in step 850 may be any one of the first and second relationships. After the set of metric constraints are determined, in step 860 an objective function of optimization is set up in accordance with the remaining of the two relationships which is not used.

Similarly, a third relationship between a set of polygons in the mask and a mask-writing difficulty metric may be determined. The set of polygons in the mask are preferably the shapes of mask openings that will be formed in a background film on the mask substrate, or alternatively, the shapes of islands of material that are left when the remainder of the background film is removed. The mask-writing difficulty metric may be mask manufacturability metrics that represent inadequate separation between features, or that represent features which are not kept distinct (i.e. features whose edges cross).

In one embodiment, when the third relationship between a set of polygons in the mask and a mask-writing difficulty metric is determined, a set of metric constraints in accordance with two of the first, second, and third relationships is imposed. In one example, at least one of the set of metric constraints is imposed as a penalty term in the objective function of optimization. The violation of the constraints is reflected into the objective function as the penalty term.

The two relationships used to determine the set of metric constraints may be any two of the first, second, and third relationships. After the set of metric constraints are determined, an objective function of optimization is set up in accordance with the remaining of the three relationships which is not used.

In another embodiment, when the third relationship between a set of polygons in the mask and a mask-writing difficulty metric is determined, a set of metric constraints is imposed in accordance with the first, second, and third relationships, i.e., the set of metric constraints is imposed according to all three relationships. After the set of metric constraints are determined, an objective function of optimization is set up in accordance with one of the three relationships. The relationship used to set up the objective function can be any one of the three relationships.

Steps 850 and 860 proceed in much the same way as steps 350 and 360 described above, except that the relationships defining the metrics a, b, c, A, B, and C now involve projection process parameters, which may be denoted s, as well as mask representation variables m. Projection process parameters s may, for example, be the intensities of source pixels in an illumination source. The optimization problem solved in step 880 may then take similar forms to one of the permutations described above, except that the projection process parameters are involved; for example i. Maximize $C(m,s)$ subject to:

ii. $a_i(m,s) > 0$ iii. $b_i(m,s) > 0$

In step 870 of the method 800, optimum constrained values of the representations of the mask and the projection process are determined based on the set of metric constraints and the objective function of the optimization. Selected nonlinear optimizer/solver, e.g. IPOPT (Interior Point OPTimization) or Augmented Lagrangian solver, will solve the nonlinear optimization problem defined by the set of metric constraints and the objective function. The optimization variables of such a nonlinear optimization problem are the representations of the mask and the projection process. The nonlinear optimizer/solver will output the optimum values of the representations of the mask and the projection process.

In step 880, the optimum constrained values of the representations of the mask and the projection process are output. As in step 380, the optimum constrained values may be displayed on a display device of a computer for viewing by a user. In another example, the optimum constrained values may be printed out on a paper. Similarly, the method 800 of FIG. 8, including at least steps 810-880, may be performed by one or more computer programs executable by one or more processors of one or more computer devices, as can be appreciated by those of ordinary skill within the art.

The method 800 of FIG. 8 may further include a step of imposing an additional metric constraint from the projection process for determining the optimum constrained values of the representations of the mask and the projection process. In one preferred embodiment, the additional constraint is that the source pixel intensities of the projection process have fixed values. The optimization variables of such a nonlinear optimization problem are only the representations of the mask when the source pixel intensities of the projection process are fixed. The nonlinear optimizer/solver will also only output the optimum values of the representations of the mask.

Once the optimum constrained values of the representation of the mask are obtained, the mask may be fabricated according to the optimum constrained values. In addition, the method may further include projecting the mask through the lithographic system onto the photoactive material in accordance with the optimum constrained values of the representation of the projection process to create a pattern in the photoactive material which closely conforms to the desired image pattern.

Figure 9:
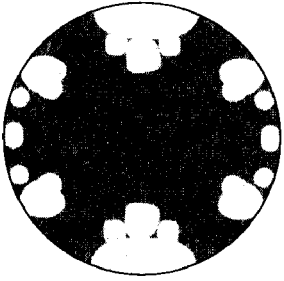
FIG. 9 shows simulation results of the ILS value of the resulted pattern features with the method in the present invention in comparison with that obtained without constraining ILS.

FIG. 9 shows simulation results of the ILS value of the resulted pattern features with the method in the present invention in comparison with that obtained without constraining ILS. As shown in FIG. 9, the ILS value of the resulted pattern features with the method in the present invention is more than 50% greater than that obtained without constraining ILS. This increased ILS value would lead to a reduction in LER in the pattern feature.

While the present invention has been particularly shown and described with respect to preferred embodiments, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. A method for illuminating a mask with a source to project a desired image pattern through a lithographic system onto a photoactive material, the method comprising:

defining a representation of the mask;

obtaining a fractional resist shot noise (FRSN) parameter;

determining a first relationship between a first set of optical intensity values and an edge roughness metric based on the FRSN parameter;

determining a second relationship between a second set of optical intensity values and a lithographic performance metric;

imposing a set of metric constraints in accordance with one of the first and second relationships;

setting up an objective function of optimization in accordance with the remaining of the first and second relationships;
determining optimum constrained values of the representation of the mask in accordance with the set of metric constraints and the objective function of optimization;
outputting the optimum constrained values of the representation of the mask;
fabricating the mask according to the optimum constrained values of the representation of the mask; and
projecting the mask through the lithographic system onto the photoactive material.

2. The method of claim 1, wherein the representation of the mask is a set of polygons with transmission coefficients determined by the mask technology.

3. The method of claim 1, wherein the representation of the mask is a set of diffraction order weights representing the light which is diffracted by the mask and passes through the pupil of the lithographic system.

4. The method of claim 1, wherein the lithographic performance metric is a process window metric, an exposure latitude (EL) metric, an edge placement error (EPE) metric, or a depth of focus (DOF) metric.

5. The method of claim 1, wherein at least one of the set of the metric constraints is imposed as a penalty term in the objective function of optimization.

6. The method of claim 1, wherein the photoactive material is a photoresist.

7. The method of claim 1, furthering comprising determining a third relationship between a set of polygons in the mask and a mask-writing difficulty metric, and the steps of imposing a set of metric constraints and setting up an objective function of optimization comprising:
imposing a set of metric constraints in accordance with two of the first, second, and third relationships; and
setting up an objective function of optimization in accordance with the remaining of the first, second, and third relationships.

8. The method of claim 7, wherein the mask-writing difficulty metric is a mask manufacturability metric.

9. A method for illuminating a mask with a source to project a desired image pattern through a lithographic system onto a photoactive material, the method comprising:
defining a representation of the mask;
obtaining a fractional resist shot noise (FRSN) parameter;
determining a first relationship between a first set of optical intensity values and an edge roughness metric based on the FRSN parameter;
determining a second relationship between a second set of optical intensity values and a lithographic performance metric;
determining a third relationship between a set of polygons in the mask and a mask-writing difficulty metric;
imposing a set of metric constraints in accordance with the first, second, and third relationships;
setting up an objective function of optimization in accordance with one of the first, second, and third relationships;
determining optimum constrained values of the representation of the mask in accordance with the set of metric constraints and the objective function of optimization;
outputting the optimum constrained values of the representation of the mask;
fabricating the mask according to the optimum constrained values of the representation of the mask; and
projecting the mask through the lithographic system onto the photoactive material.

10. A method for illuminating a mask with a source to project a desired image pattern through a lithographic system onto a photoactive material, the method comprising:
defining a representation of the mask and a representation of a projection process;
obtaining a fractional resist shot noise (FRSN) parameter;
determining a first relationship between a first set of optical intensity values and an edge roughness metric based on the FRSN parameter;
determining a second relationship between a second set of optical intensity values and a lithographic performance metric;
imposing a set of metric constraints in accordance with one of the first and second relationships;
setting up an objective function of optimization in accordance with the remaining of the first and second relationships;
determining optimum constrained values of the representations of the mask and the projection process in accordance with the set of metric constraints and the objective function of optimization;
outputting the optimum constrained values of the representations of the mask and the projection process;
fabricating the mask according to the optimum constrained values of the representation of the mask; and
projecting the mask through the lithographic system onto the photoactive material according to the optimum constrained values of the representation of the projection process.

11. The method of claim 10, wherein the representation of the mask is a set of polygons with transmission coefficients determined by the mask technology.

12. The method of claim 10, wherein the representation of the mask is a set of diffraction order weights representing the light which is diffracted by the mask and passes through the pupil of the lithographic system.

13. The method of claim 10, wherein the representation of the projection process is a set of source pixel intensities.

14. The method of claim 10, further comprising imposing an additional metric constraint from the projection process, and wherein the step of determining optimum constrained values comprises determining optimum constrained values of the representations of the mask and the projection process in accordance with the set of metric constraints, the additional metric constraint, and the objective function of optimization.

15. The method of claim 14, wherein the additional constraint is that the source pixel intensities of the projection process have fixed values.

16. The method of claim 10, wherein at least one of the set of the metric constraints is imposed as a penalty term in the objective function of optimization.

17. The method of claim 10, wherein the lithographic performance metric is a process window metric, an exposure latitude (EL) metric, an edge placement error (EPE) metric, or a depth of focus (DOF) metric.

18. The method of claim 10, furthering comprising determining a third relationship between a set of polygons in the mask and a mask-writing difficulty metric, and the steps of imposing a set of metric constraints and setting up an objective function of optimization comprising:
imposing a set of metric constraints in accordance with two of the first, second, and third relationships; and
setting up an objective function of optimization in accordance with the remaining of the first, second, and third relationships.

19. The method of claim 18, wherein the mask-writing difficulty metric is a mask manufacturability metric.

20. A method for illuminating a mask with a source to project a desired image pattern through a lithographic system onto a photoactive material, the method comprising:
- defining a representation of the mask and a representation of a projection process;
- obtaining a fractional resist shot noise (FRSN) parameter;
- determining a first relationship between a first set of optical intensity values and an edge roughness metric based on the FRSN parameter;
- determining a second relationship between a second set of optical intensity values and a lithographic performance metric;
- determining a third relationship between a set of polygons in the mask and a mask-writing difficulty metric;
- imposing a set of metric constraints in accordance with the first, second, and third relationships;
- setting up an objective function of optimization in accordance with one of the first, second, and third relationships;
- determining optimum constrained values of the representations of the mask and the projection process in accordance with the set of metric constraints and the objective function of optimization; and
- outputting the optimum constrained values of the representations of the mask and the projection process; and
- projecting the mask through the lithographic system onto the photoactive material according to the optimum constrained values of the representation of the projection process.

21. A machine readable storage medium having one or more machine readable program codes stored thereon for causing the machine to perform a method for illuminating a mask with a source to project a desired image pattern through a lithographic system onto a photoactive material, in the medium, the one or more programs, when executed by a computer, performs the method comprising:
- defining a representation of the mask;
- obtaining a fractional resist shot noise (FRSN) parameter;
- determining a first relationship between a first set of optical intensity values and an edge roughness metric based on the FRSN parameter;
- determining a second relationship between a second set of optical intensity values and a lithographic performance metric;
- imposing a set of metric constraints in accordance with one of the first and second relationships;
- setting up an objective function of optimization in accordance with the remaining of the first and second relationships;
- determining optimum constrained values of the representation of the mask in accordance with the set of metric constraints and the objective function of optimization; and
- outputting the optimum constrained values of the representation of the mask.

22. The machine readable storage medium of claim 21, wherein the representation of the mask is a set of polygons with transmission coefficients determined by the mask technology.

23. The machine readable storage medium of claim 21, wherein the representation of the mask is a set of diffraction order weights representing the light which is diffracted by the mask and passes through the pupil of the lithographic system.

24. The machine readable storage medium of claim 21, wherein the lithographic performance metric is a process window metric, an exposure latitude (EL) metric, an edge placement error (EPE) metric, or a depth of focus (DOF) metric.

25. The machine readable storage medium of claim 21, wherein at least one of the set of the metric constraints is imposed as a penalty term in the objective function of optimization.

26. The machine readable storage medium of claim 21, wherein the photoactive material is a photoresist.

27. The machine readable storage medium of claim 21, wherein the method furthering comprising determining a third relationship between a set of polygons in the mask and a mask-writing difficulty metric, and the steps of imposing a set of metric constraints and setting up an objective function of optimization comprising:
- imposing a set of metric constraints in accordance with two of the first, second, and third relationships; and
- setting up an objective function of optimization in accordance with the remaining of the first, second, and third relationships.

28. The machine readable storage medium of claim 27, wherein the mask-writing difficulty metric is a mask manufacturability metric.

29. The machine readable storage medium of claim 28, wherein the photoactive material is a photoresist.

30. The machine readable storage medium of claim 21, wherein the method furthering comprising determining a third relationship between a set of polygons in the mask and a mask-writing difficulty metric, and the steps of imposing a set of metric constraints and setting up an objective function of optimization comprising:
- imposing a set of metric constraints in accordance with two of the first, second, and third relationships; and
- setting up an objective function of optimization in accordance with the remaining of the first, second, and third relationships.

31. The machine readable storage medium of claim 30, wherein the mask-writing difficulty metric is a mask manufacturability metric.

32. A machine readable storage medium having one or more machine readable program codes stored thereon for causing the machine to perform a method for illuminating a mask with a source to project a desired image pattern through a lithographic system onto a photoactive material, in the medium, the one or more programs, when executed by a computer, performs the method comprising:
- defining a representation of the mask;
- obtaining a fractional resist shot noise (FRSN) parameter;
- determining a first relationship between a first set of optical intensity values and an edge roughness metric based on the FRSN parameter;
- determining a second relationship between a second set of optical intensity values and a lithographic performance metric;
- determining a third relationship between a set of polygons in the mask and a mask-writing difficulty metric;
- imposing a set of metric constraints in accordance with the first, second, and third relationships;
- setting up an objective function of optimization in accordance with one of the first, second, and third relationships;
- determining optimum constrained values of the representation of the mask in accordance with the set of metric constraints and the objective function of optimization; and
- outputting the optimum constrained values of the representation of the mask.

33. A machine readable storage medium having one or more machine readable program codes stored thereon for causing the machine to perform a method for illuminating a mask with a source to project a desired image pattern through a lithographic system onto a photoactive material, in the medium, the one or more programs, when executed by a computer, performs the method comprising:
- defining a representation of the mask and a representation of a projection process;
- obtaining a fractional resist shot noise (FRSN) parameter;
- determining a first relationship between a first set of optical intensity values and an edge roughness metric based on the FRSN parameter;
- determining a second relationship between a second set of optical intensity values and a lithographic performance metric;
- imposing a set of metric constraints in accordance with one of the first and second relationships;
- setting up an objective function of optimization in accordance with the remaining of the first and second relationships;
- determining optimum constrained values of the representations of the mask and the projection process in accordance with the set of metric constraints and the objective function of optimization; and
- outputting the optimum constrained values of the representations of the mask and the projection process.

34. The machine readable storage medium of claim 33, wherein the representation of the mask is a set of polygons with transmission coefficients determined by the mask technology.

35. The machine readable storage medium of claim 33, wherein the representation of the mask is a set of diffraction order weights representing the light which is diffracted by the mask and passes through the pupil of the lithographic system.

36. The machine readable storage medium of claim 33, wherein the representation of the projection process is a set of source pixel intensities.

37. The machine readable storage medium of claim 33, further comprising imposing an additional metric constraint from the projection process, and wherein the step of determining optimum constrained values comprises determining optimum constrained values of the representations of the mask and the projection process in accordance with the set of metric constraints, the additional metric constraint, and the objective function of optimization.

38. The machine readable storage medium of claim 37, wherein the additional constraint is that the source pixel intensities of the projection process have fixed values.

39. The machine readable storage medium of claim 33, wherein at least one of the set of the metric constraints is imposed as a penalty term in the objective function of optimization.

40. The machine readable storage medium of claim 33, wherein the lithographic performance metric is a process window metric, an exposure latitude (EL) metric, an edge placement error (EPE) metric, or a depth of focus (DOF) metric.

41. A machine readable storage medium having one or more machine readable program codes stored thereon for causing the machine to perform a method for illuminating a mask with a source to project a desired image pattern through a lithographic system onto a photoactive material, in the medium, the one or more programs, when executed by a computer, performs the method comprising:
- defining a representation of the mask and a representation of a projection process;
- obtaining a fractional resist shot noise (FRSN) parameter;
- determining a first relationship between a first set of optical intensity values and an edge roughness metric based on the FRSN parameter;
- determining a second relationship between a second set of optical intensity values and a lithographic performance metric;
- determining a third relationship between a set of polygons in the mask and a mask-writing difficulty metric;
- imposing a set of metric constraints in accordance with the first, second, and third relationships;
- setting up an objective function of optimization in accordance with one of the first, second, and third relationships;
- determining optimum constrained values of the representations of the mask and the projection process in accordance with the set of metric constraints and the objective function of optimization; and
- outputting the optimum constrained values of the representations of the mask and the projection process.

* * * * *